United States Patent [19]
Duvvury

[11] Patent Number: 5,502,317
[45] Date of Patent: Mar. 26, 1996

[54] SILICON CONTROLLED RECTIFIER AND METHOD FOR FORMING THE SAME

[75] Inventor: Charvaka Duvvury, Plano, Tex.

[73] Assignee: Texas Instruments Incorporated, Dallas, Tex.

[21] Appl. No.: 328,211

[22] Filed: Oct. 25, 1994

Related U.S. Application Data

[62] Division of Ser. No. 91,544, Jul. 14, 1993, Pat. No. 5,369,041.

[51] Int. Cl.$^6$ .................................................. H01L 29/74
[52] U.S. Cl. .......................... 257/107; 257/110; 257/119; 257/122; 257/124; 257/146; 257/173; 257/360
[58] Field of Search .................................. 257/360, 110, 257/119, 122, 124, 146, 173, 107

[56] References Cited

U.S. PATENT DOCUMENTS

| | | | |
|---|---|---|---|
| 4,005,450 | 1/1977 | Yoshida et al. | 357/23 |
| 4,052,229 | 10/1977 | Pashley | 148/1.5 |
| 4,400,711 | 8/1983 | Avery | 357/43 |
| 4,808,544 | 2/1989 | Matsui | 437/44 |
| 4,845,045 | 7/1989 | Shacham et al. | 437/30 |
| 4,878,100 | 10/1989 | McDavid | 357/23.3 |
| 4,920,445 | 4/1990 | Jun | 361/91 |
| 4,939,616 | 7/1990 | Rountree | 257/360 |
| 5,012,317 | 4/1991 | Rountree | 357/38 |
| 5,019,888 | 5/1991 | Scott et al. | 357/41 |
| 5,072,273 | 12/1991 | Avery | 357/38 |
| 5,140,401 | 8/1992 | Ker et al. | 257/360 |
| 5,162,888 | 11/1992 | Co et al. | 257/408 |
| 5,221,635 | 1/1993 | Duvvury | 257/360 |
| 5,281,841 | 1/1994 | Van Roozendaal et al. | 257/360 |

FOREIGN PATENT DOCUMENTS

| | | |
|---|---|---|
| 61-214576 | 3/1985 | Japan . |
| 6211273 | 7/1985 | Japan . |

OTHER PUBLICATIONS

Lin et al., "A CMOS VLSI ESD Input Protection Device, DIFIDW" Electrical Overstress/Electrostatic Discharge Symposium Proceedings, Oct 2–4, 1984, p. 202–209.
Maloney, "Contact Injection: A Major Cause of ESD Failure in Integrated Circuits", Electrical Overstress/Electrostatic Discharge Symposium Proceedings, Sep. 23–25, 1986, pp. 166–172.
Nelsen et al., "Design and Test Results for a Robust CMOS VLSI Input Protection Network", Electrical Overstress/ Electrostatic Discharge Symposium Proceedings, Sep. 23–25, 1986, pp. 188–192.

*Primary Examiner*—Edward Wojciechowicz
*Attorney, Agent, or Firm*—Ira S. Matsil; James C. Kesterson; Richard L. Donaldson

[57] ABSTRACT

A semiconductor controlled rectifier is disclosed herein. In a preferred embodiment, a first n-doped region 112 is formed in a p-doped semiconductor layer 126. A first n-well region 122 is formed within the first doped region 112. This well 122 extends through the region 112 and into the layer 126. A second n-doped region 114 is also formed in the layer 126. The second region 1114 is spaced from the first region 112. A second n-well 142 is formed in the layer 126 such that it partially overlaps the second region 114. A n-doped region 144 and a p-doped region 146 are each formed in the second n-well 142 and abut one another.

12 Claims, 5 Drawing Sheets

SILICON CONTROLLED RECTIFIER AND METHOD FOR FORMING THE SAME

CROSS-REFERENCE TO RELATED APPLICATIONS

This is a division of application Ser. No. 08/091,544, filed Jul. 14, 1993, now U.S. Pat. No. 5,369,041 issued Nov. 29, 1994.

The following co-assigned patent applications are hereby incorporated herein by reference:

| Ser. No. | Filing Date | TI Case No. | U.S. Pat. No. | Issue Date |
|---|---|---|---|---|
| 07/213,499 | 6/27/88 | TI-11444B | 5,012,317 | 4/30/91 |
| 07/434,592 | 11/13/89 | TI-13141A | 4,939,616 | 7/03/90 |
| 07/488,590 | 3/05/90 | TI-14246 | Pending | |
| 07/808,826 | 12/17/91 | TI-16108 | 5,221,635 | 6/22/93 |
| 08/042,849 | 4/05/93 | TI-14912B | Pending | |

1. Field of the Invention

This invention generally relates to the fabrication of semiconductor devices and specifically to a silicon controlled rectifier (SCR) device and a method of forming this device.

2. Background of the Invention

Integrated circuits are vulnerable to a phenomenon generically referred to as electrostatic discharge ("ESD"). During handling, integrated circuits can build up relatively large static charges on their inputs. These charges, if not properly compensated for, may flow or "discharge" to a lower potential region. Discharging in this way produces large electric fields within the transistors that are immediately connected to the various inputs and outputs of a particular circuit. High electric fields in turn, produce high temperature gradients and ultimately yield electrothermo migration ("ETM") within the transistor. ETM describes how a transistor fails when the contact metallization migrates across the transistor under the combined effects of electrical and thermal stress to produce a short. ETM causes irreversible circuit failures. ESD and ETM become more severe as circuits dimensions decrease. The smaller the dimension of, for instance, a doped drain region, the higher the electric field will be per charge. As a result, new semiconductor technologies require more effective designs to overcome these problems.

SUMMARY OF THE INVENTION

Other objects and advantages will be obvious, and will in part appear hereinafter and will be accomplished by the present invention which provides a method and device for circuit protection with a silicon controlled rectifier.

A silicon controlled rectifier is disclosed herein. In a preferred embodiment, a first n-doped region is formed in a p-doped semiconductor layer. A first n-well region is formed within the first n-doped region. This well extends through the region and into the layer and may extend outside one end of the n-doped region. A second n-well is formed in the layer and an n-doped and a p-doped region are each formed in the second n-well. These regions may abut one another. In one embodiment, a second n-doped region is also formed in the layer and is spaced from the first n-doped region. This region may be formed such that it partially overlaps the second region. In yet another embodiment, a conductive gate insulatively overlies the semiconductor layer between the first and second doped regions.

BRIEF DESCRIPTION OF THE DRAWINGS

The above features of the present invention will be more clearly understood from consideration of the following descriptions in connection with accompanying drawings in which:

FIGS. 13a–13c depict cross-sectional views of various stages of the fabrication of the embodiment of FIG. 12a.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

U.S. Pat. No. 5,221,635(TI-16108) issued to Charvaka Duvvury on Jun. 22, 1993 describes a novel field effect transistor. The present invention describes a circuit and structure which may utilize a transistor as described in the co-assigned patent. Accordingly, the transistor will be described herein followed by a description of the silicon controlled rectifier (SCR) which may utilize the transistor. Variations of the SCR are also described.

Figure 1:
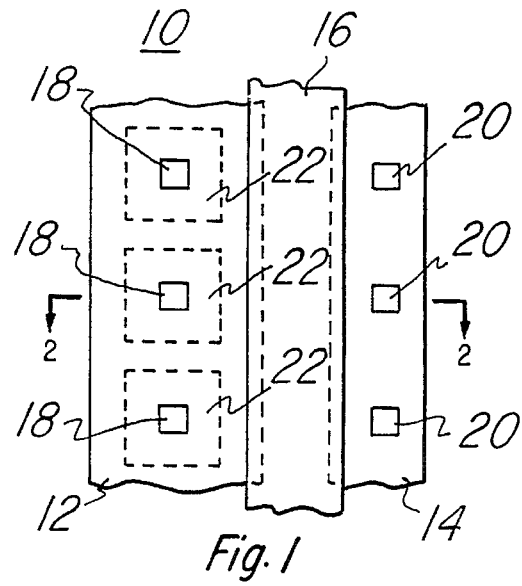
FIG. 1 depicts in planar view a transistor made according to the preferred embodiment of the present invention.

FIG. 1 depicts generally a planar view of a metal oxide semiconductor field-effect transistor 10 ("MOSFET") wherein a second n region provides improved ESD performance. In a preferred embodiment, MOSFET 10 has a first n-type source-drain region 12 and a second n-type source-drain region 14. Each region is either doped or implanted into a p-type substrate. An insulator 24 (depicted in FIG. 2)

separates metal gate 16 from the underlying p-substrate 26. Contact pads 18 and 20 supply or remove electric current from doped regions 12 and 14 respectively. Pads 18 and 20 are typically exposed subregions of regions 12 and 14 and permit an ohmic contact to other components (not depicted). First source/drain region 12 also contains an n-well 22 below each of the contact pads 18 or, a single n-well 22 may be used to cover all the contacts. As will be described below, each n-well 22 increases the ESD performance of MOSFET 10.

Conductive gate 16 controls the flow of current between regions 12 and 14 by creating an electric field between the two regions. An electric field causes a channel to form in the substrate between regions 12 and 14 and below the gate insulating layer. The conductive gate 16 may comprise a metal such as aluminum.

Figure 2:
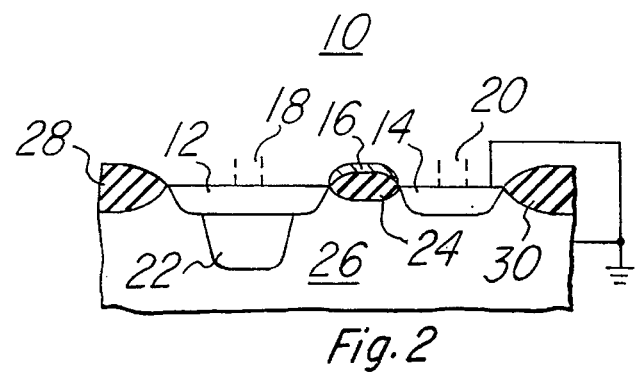
FIG. 2 depicts a cross sectional view taken along line 2—2 of FIG 1.

FIG. 2 depicts a cross-sectional view of MOSFET 10 along line 2—2 of FIG. 1 that shows the vertical integration of n-well 22 and first source-drain region 12. In addition, insulating layer 24 separates gate 16 from substrate 26. Substrate 26 includes a p-type semiconductor material, while regions 12 and 14 are more heavily doped "n+") with n-type impurities. A lower concentration of n-type impurities than either region 12 or 14 dopes n-well 22. Typically, the concentration of n carriers is $10^{19}$ atoms/cm$^3$ in regions 12 and 14.

Transistor 10 naturally forms two p-n junctions that act as diodes. One of these, the junction between region 12 and substrate 26, may act as a barrier to the discharge of positive electrostatic charge from contact 18 to the ground plane through substrate 26. ESD from contact 20 is not a concern for positive polarity stress since, region 14 electrically connects to substrate 26 through the ground plane. Also, it is not a concern for negative polarity stress for grounded substrate technologies. However, the barrier between region 12 and substrate 26 limits the ESD characteristics of region 12 in previous transistors.

There are several desirable characteristics for the transistor of FIGS. 1 and 2. A low resistance is desired between contacts 18 and 20 and a low capacitance at regions 12 and 22. In addition, a low avalanche (breakdown) voltage is desired at the perimeter of source/drain region 12. Also, it is desirable to have a high avalanche threshold under region 18.

The n-well region 22 will help to increase the avalanche threshold under region 18. It is further expected that the avalanche voltage at the perimeter of source/drain region 12 will not be affected. The resistance between the contacts 18 and 20 and the capacitance at regions 12 and 22 should not be affected unless inclusion of the n-well 22 increases the feature size.

According to the preferred embodiment, a well of lightly doped n-type carriers below contact 18 in region 12 improves ESD performance without substantially increasing system resistance or capacitance. Lightly doping a region below contact 18, increases the breakdown voltage between region 22 and substrate 26 to between 40 and 50 volts. The region 22 should have no effect on transistor breakdown voltage which is determined by the interface of regions 12 and 26.

Figure 6:
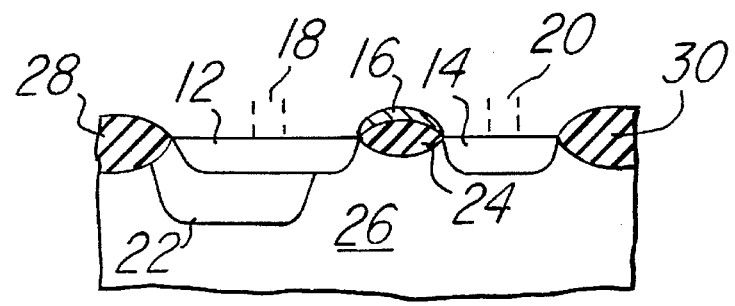
FIG. 6 depicts a cross sectional view of a transistor according to an alternative embodiment of the present invention.

Typically, the size of the contact pad 18 helps determine the size of n-well 22. The footprint of the n-well should be generally the same size or larger than the footprint of the contact pad 18. Present semiconductor processes, however, may fabricate contact pads 18 substantially smaller than n-well 22. In particular, present technology limits the size of n-well 22 to approximately 6×6 μm$^2$, while contact pad 18 may be approximately 1.5×1.5 μm$^2$. N-well 22 must extend below the bottom of the overlying source-drain region 12. N-well 22 preferably extends to a total depth of five to seven times the depth of region 12. The n-well 22 may extend beyond the boundary of region 12 and under insulator 28 without adversely effecting the device performance (as shown in FIG. 6). It is desirable, however, that the n-well 22 not extend to the insulator 28. In other words, it is desirable that the source/drain region 12 abut the substrate 26 at the channel junction.

N-well 22 has little or no effect on the performance of MOSFET 10. This is because the high resistive n-well is not in the direct current path from source to drain. The depth of n-well 22 therefore ranges from 1 to 2 μm for typical 0.5 μm processes.

Transistor 10 may be fabricated from a combination of photolithographic processes according to known methods. The following discussion, describes an example of one possible process flow.

Transistor 10 begins with a p-type semiconductor substrate, preferably a p-type silicon substrate 26. Substrate 26 is then masked such that only the surface of substrate 26 where the n-well 22 will be formed is exposed. The n-well 22 is then formed preferably by an implantation followed by an anneal step which drives in the dopants.

Next the surface of the semiconductor layer 26 where the regions 12 and 14 will be formed are covered with a mask, preferably a nitfide. Field oxide regions 28 and 30 as well as insulating layer 24 are formed in accordance with well-known processes utilized to prove device-to-device isolation. In particular, regions 28 and 30 may be formed by the local-oxidation-of-silicon ("LOCOS") or the poly-buffered LOCOS process ("PBL"). The remaining mask is then removed.

The entire workpiece is covered with 5,000 to 10,000 Angstroms of aluminum to form gate 16. The unwanted aluminum will be removed with the underlying photoresist layer when the resist layer is removed.

The substrate at this point then acts as a self-aligned implant mask for regions 12 and 14. The heavily doped source-drain regions 12 and 14 are implanted with an n-type species such as arsenic, phosphorus, or antimony. In a preferred embodiment, the implantation is performed at about 100 keV at a dose of about 1E15 atoms/cm$^2$. Following the implantation, a rapid thermal anneal ("RTA") or furnace anneal process may be performed. The RTA process is preferably performed at about 1,000° C. for about 30 seconds. Furnace annealing may be instead used at, for instance, about 900° C. for about one hour. The resulting n+ regions are approximately 0.5 μm deep and have a resistivity of approximately 25 to 30 ohms/sq.

In alternate embodiment fabrication process, a third mask is then applied to obscure all of region 12 except the central area around the future site of each contact pad. A lighter dose of the same species is then implanted to form n-well 22 to a depth of approximately 1 micron. The second implantation step may be accomplished with an implant energy of 150 keV and a dose of 1E13 atoms/cm$^2$. This results in an n-type region having a resistivity of approximately 1500 Ohms/sq. The third photoresist layer may then be removed.

FET 10 is completed by applying another mask, exposing contact pads 18 on regions 12 and 14, depositing an interconnect layer, and patterning the layer to connect FET 10 to other elements on substrate 26.

Figure 3:
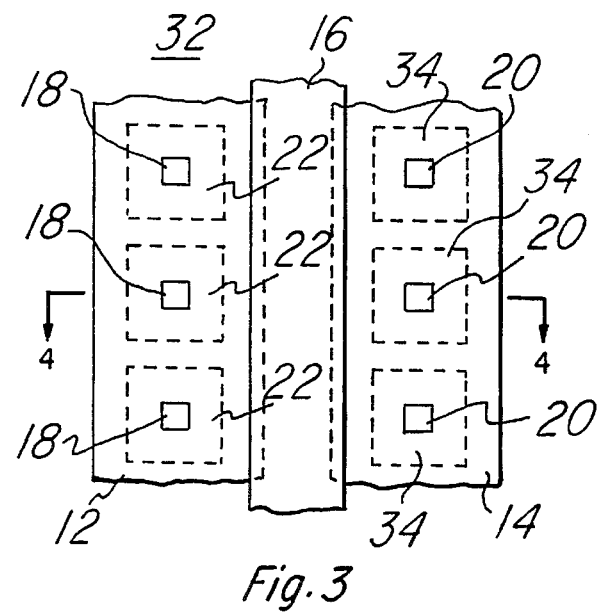
FIG. 3 depicts in planar view of a transistor according to an alternative embodiment of the present invention.
Figure 4:
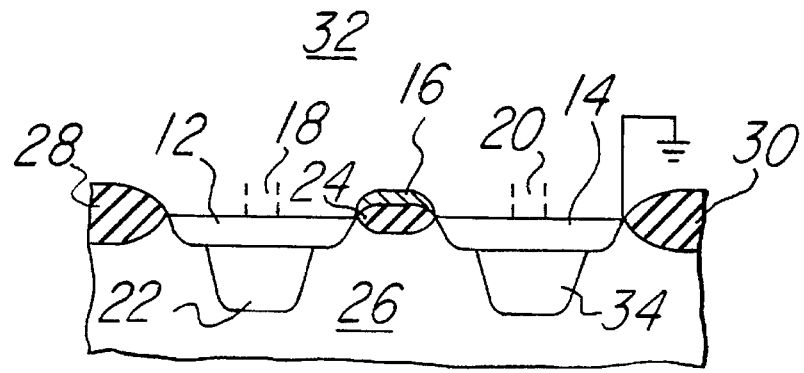
FIG. 4 depicts a cross sectional view taken along line 4—4 of FIG. 3.

FIGS. 3 and 4 depict a second embodiment of the disclosed invention for use with floating substrate technology MOSFETs. NMOS FET 32 differs from the transistor depicted in FIGURES 1 and 2 in that source drain region 14 is not connected to substrate 26. Electrostatic discharge may therefore occur under certain circumstances between second region 14 and substrate 26 for negative polarity stress. In such a case, it is advantageous to place a second n-well 34 to protect transistor 32 more completely. N-well 34 is constructed using the same techniques as described above.

Although the disclosed invention is described in connection with an abrupt junction thick-field NMOS FET, its scope should not be limited to such devices. The disclosed invention is applicable to other technologies including those transistors fabricated with lightly doped drains, double diffused drains and with thin oxide or polysilicon gate transistors.

Figure 5:
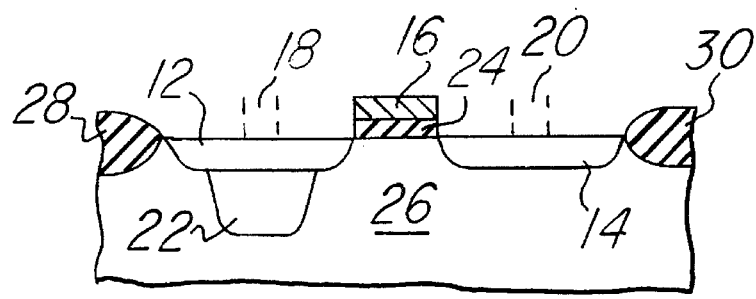
FIG. 5 depicts a cross sectional view of a thin oxide transistor.

FIG. 5, for example, illustrates a thin gate oxide transistor. During fabrication, the gate oxide 24 is preferably deposited subsequent to forming the field insulating regions 28 and 30 but prior to implanting the source/drain regions 12 and 14. The gate layer may then be deposited followed by a stack etch. As previously mentioned, the gate 16 may comprise a metal such as aluminum or a semiconductor such as polysilicon.

Another embodiment transistor 10 is illustrated in FIG. 6. In this embodiment, the n-well 22 extends below the source/drain region 12 and under field insulating region 28. This embodiment may be preferable to minimize the required feature size of the device. In other words, if the n-well 22 is to be completely beneath the source/drain region 12, it is likely the source/drain region 12 will have to be larger than the minimum feature size. It should be noted, however, that it is preferable that the well region 22 not extend to the junction between source/drain region 12 and the semiconductor layer 26 beneath insulating region 24. This is because it is desirable to have a low avalanche (breakdown) voltage at the perimeter of region 12.

Figure 7:
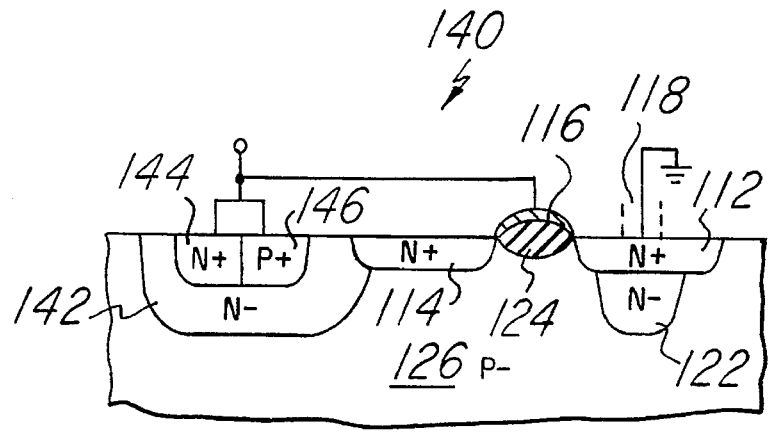
FIG. 7 depicts a cross sectional view of a first embodiment silicon controlled rectifier.

Referring now to FIG. 7, a first embodiment silicon controlled rectifier (SCR) 140 is illustrated in cross-sectional view. The SCR 140 is sometimes referred to as a modified lateral SCR (MLSCR). The SCR 140 is fabricated on a semiconductor substrate 126. The semiconductor substrate 126 preferably comprises silicon but other semiconductors such as germanium or gallium arsenide may also be used. As illustrated in FIG. 7, the SCR device 140 may be fabricated directly in the semiconductor substrate. Alternatively, the device 140 may be fabricated in a structure on the substrate. As examples, the layer 126 may comprise an expitaxial layer formed on a substrate, a well (or tub or tank) formed within a substrate, a semiconductor on insulator (SOI) or a combination of these. Therefore, the substrate 126 will be referred to more generally as a semiconductor layer 126.

Doped regions 112 and 114 are formed in the surface of layer 126 and are separated by insulating region 124. In the preferred embodiment, doped regions 112 and 114 comprise n-doped silicon regions and insulating region 124 comprises an oxide such as silicon dioxide.

Another doped region 122 is formed within region 112 and extends below region 112 and into semiconductor layer 126. The region 122 is formed so that it surrounds the contact 118. Accordingly, the size of the contact pad 118 will typically determine the size of the n-well 122.

As before, the footprint of the n-well 122 should be generally the same size or larger than the footprint of the contact pad 118. Present semiconductor processes, however, may fabricate contact pads 118 substantially smaller than n-well 122. For example, present technology limits the size of n-well 122 to approximately 6×6 µm², while contact pad 118 may be approximately 1.5×1.5 µm². N-well 122 almost always extends below the bottom of the overlying doped region 112. N-well 122 preferably extends to a total depth of five to seven times the depth of region 112. N-well 122 within region 118 has little or no effect on the performance of the device. The depth of n-well 122 therefore ranges from 1 to 2 µm. for typical 0.5 µm processes.

A conductive region 116 is formed overlying insulating region 124. Conductive region 116 may comprise a metal such as aluminum or a semiconductor such as doped polysilicon.

A well region 142 is also formed in semiconductor layer 126. The well region 142 typically overlaps the doped region 114. In the preferred embodiment, the well region comprises n-doped silicon.

N-doped region 144 and p-doped region 146 are formed in well region 142. In the preferred embodiment, the doped regions 144 and 146 comprise silicon which is more heavily doped than the well region 142. The regions 144 and 146 may abut each other but do not need to.

For the n-doped regions, dopants such as arsenic or phosphorus are preferably used but other dopants such as antimony may also be used. For the p-doped regions, boron is the preferred dopant but other dopants such as aluminum or gallium may be used. Combinations of various dopants may also be used.

In a preferred embodiment, doped regions 144 and 146 are electrically coupled together along with conductive region 116. This connection is illustrated in FIG. 7. In ESD protection applications, the regions 144, 146 and 116 may be coupled to an input/output pad for which ESD protection is desirable.

Figure 8:
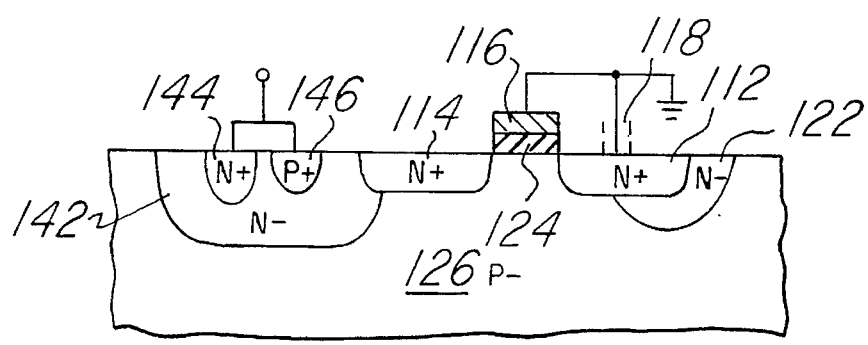
FIG. 8 depicts a cross sectional view of a modified version of the embodiment of FIG. 7.

The structure of FIG. 7 may be modified in a number of ways. As previously noted, the doped regions 144 and 146 do not necessarily abut one another. In addition, the insulator 124 may be a deposited insulator such as an oxide. If a thin insulator is used, the device is sometimes referred to as a low voltage triggered SCR (LVTSCR). Also, the region 122 may extend beyond the doped region 112 on a side opposite the insulator 124. Each of the variations is illustrated in the embodiment of FIG. 8. It should be noted, however, that only some of the features need be incorporated in a given design if so desired.

Figure 9:
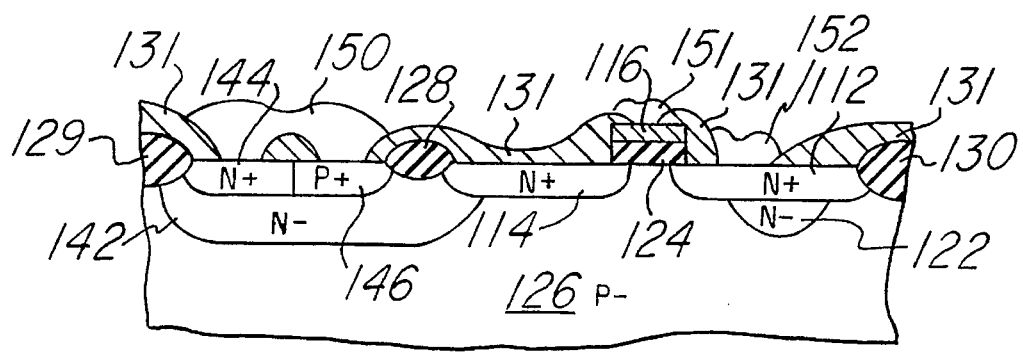
FIG. 9 depicts a cross sectional view of an SCR which illustrates the insulating regions which may be formed on the device.

Referring now to FIG. 9, a more detailed cross-sectional diagram of an embodiment SCR is illustrated. Insulating regions 128, 129 and 130 preferably comprise thermally grown thick oxide regions. A second insulating layer 131 is formed over the structure and contact holes are formed therein. Conductive contacts 150, 151 and 152 are formed in the contact holes.

In the preferred embodiment, the insulating layer 131 comprises a deposited oxide such as silicon dioxide or a doped glass such as PSG or BPSG. The conductive contacts preferably comprise a metal such as aluminum.

Figure 10:
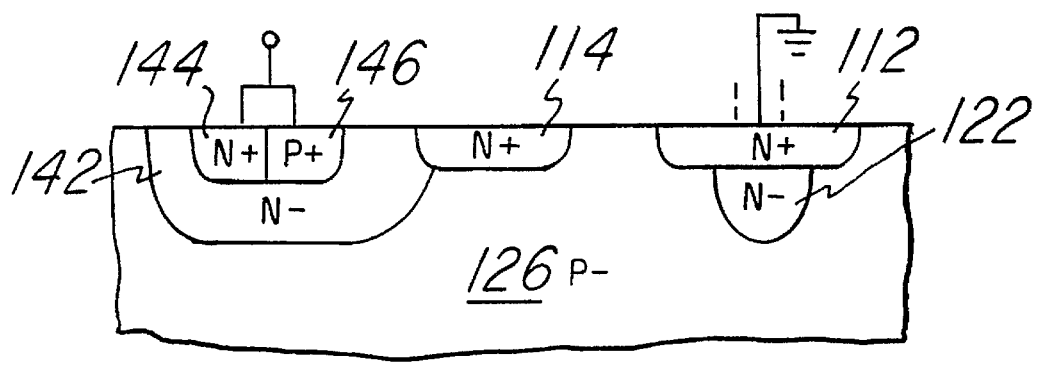
FIG. 10 depicts a cross sectional view of a second embodiment silicon controlled rectifier.

A second embodiment SCR 150 is illustrated in FIG. 10. This embodiment is sometimes referred to as a modified SCR. The structure of the second embodiment SCR 150 is essentially the same as that of the SCR 140 shown in FIG. 7 except the insulating region 124 and conductive region 116 are eliminated. The structure of FIG. 10 is similar to that discussed in U.S. Pat. No. 4,939,616, incorporated herein by reference.

In the preferred embodiment, regions 144 and 146 are coupled together. In ESD protection applications, the regions 144 and 146 may be coupled to an input/output pad for which ESD protection is desirable. In addition, the doped region 112 is typically coupled to a reference node (e.g., ground).

The SCR devices illustrated in FIGS. 7 and 10 are effective for ESD protection applications. The circuit offers protection as a pnpn device for positive stress and as a large n-/p diode for negative stress for grounded substrate devices. The n+ region 114 is placed on the n-well 142 boundary facing the cathode to form a field oxide 124 triggered SCR (as illustrated in FIG. 10). In the embodiment illustrated in FIG. 7, the conductive gate 116 is placed over the oxide 124 to create a thin oxide triggered SCR.

Figure 11:
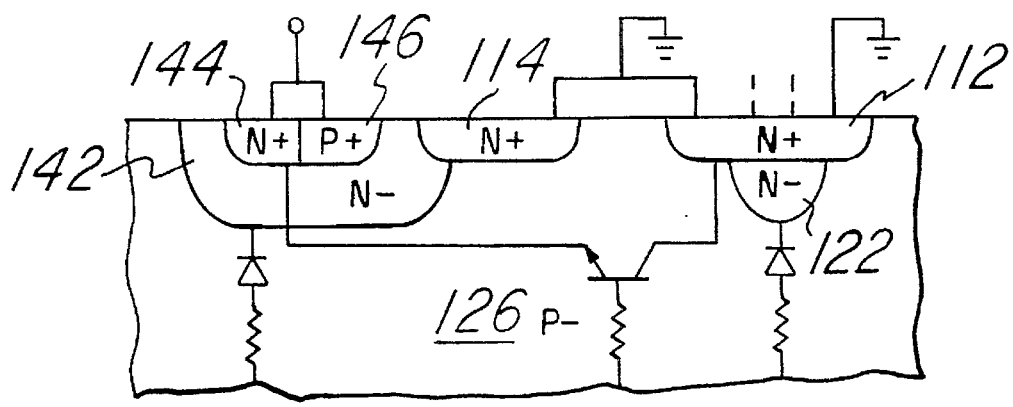
FIG. 11 depicts a schematic of the parasitic effects which may operate during use of the present invention.

These SCR circuits effectively clamp the input transient to a low holding voltage thus discharging the ESD stress pulse with a low power dissipation. The effectiveness of these SCRs may improve for thicker epitaxial substrates. For negative polarity stress, there is no SCR action, and the protection is given by the n-well 142/p-substrate 126 diode. As illustrated in FIG. 11, a parasitic npn device exists in the SCR structure. This device will tend to turn on under negative stress and cause premature failure or contact damage if well region 122 is not included. However, the structure illustrated in FIGS. 7 and 10 should suppress the contact damage due to avalanching of the contact diode for negative stress in floating substrate devices.

In LVTSCR case (illustrated in FIG. 7) without well region 122, the n-/p-substrate diode may not turn on effectively if the epitaxial thickness is relatively large. In this device, the lateral npn (n+region 112 as collector, substrate 126 as base and n+ region 114 as emitter), may tend to turn on. Similarly, stress would be placed on the reverse n+112/substrate diode. Failure analysis performed on devices built without the well region 122 has found that the contacts in the cathode are damaged for this type of stress polarity.

On the other hand, with the present invention, many of these problems are eliminated. The technique described herein is especially useful for thick epitaxial processes such as those used for CMOS technologies integrating power MOSFETS. The n-well 122 around the cathode contacts 118 will not introduce resistance to the SCR cathode since in the parallel path the n+ region 112 is substantially less than the n-region 122 sheet resistance.

Figure 12A:
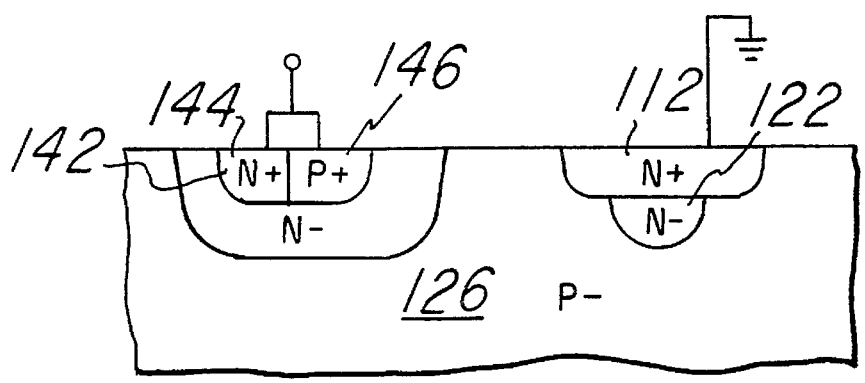
FIG. 12a depicts a cross sectional view of a third embodiment silicon controlled rectifier and FIG. 12b depicts a planar view of this embodiment.
Figure 12B:
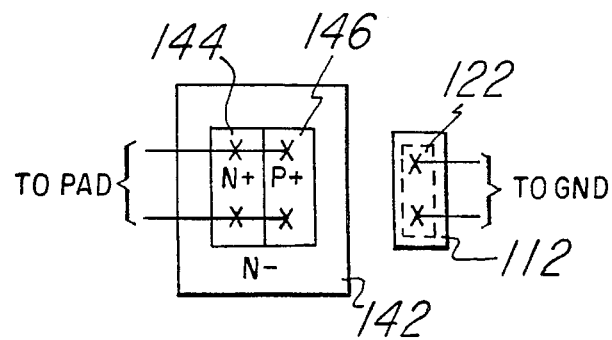

A third embodiment SCR is illustrated in cross-sectional view in FIG. 12a and in plan view in FIG. 12b.

A doped region 112 is formed in semiconductor layer 126. A less heavily doped well region 122 is formed extending through doped region 112 and into semiconductor layer 126.

A second well region 142 is formed in the semiconductor layer and is spaced from doped region 112. More heavily doped regions 144 and 146 are formed with the second well 142. In the preferred embodiment, the doped regions 144 and 146 are of opposite conductivity types and abut each other.

Figure 13A:
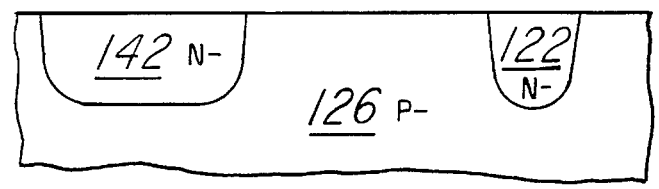
Figure 13B:
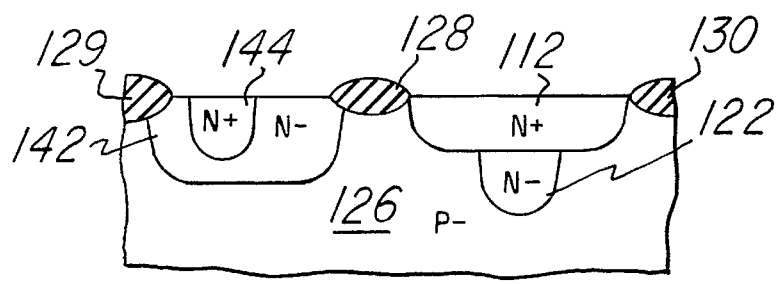
Figure 13C:
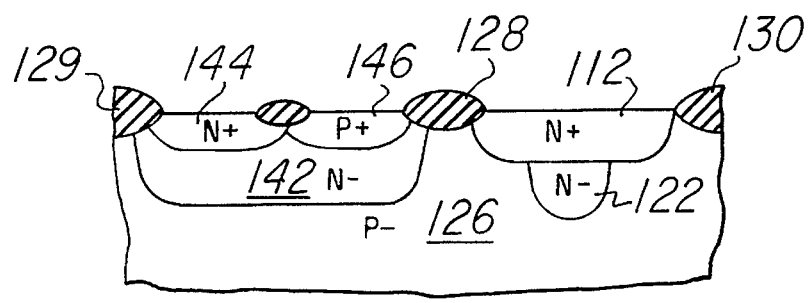

The structure of FIG. 12a can be fabricated with three doping steps as illustrated in FIGS. 13a–13c. First, a mask layer (not shown) is patterned to expose the well regions. The n-wells 122 and 142 are then formed preferably by ion implantation of either arsenic or phosphorus (or both). Alternatively, other doping methods such as diffusion may be used or other dopants. A thin insulating layer (not shown) may be formed over the surface of the semiconductor layer 126 prior to forming the doped regions. The well regions 122 and 142 may be driven in with a relatively high temperature anneal.

Referring now to FIG. 13b, insulating regions 128–130 are formed preferably by thermal oxidation as previously discussed. Next more heavily doped regions 112 and 144 are formed. Once again, these regions 112 and 144 are preferably implanted but alternatively may be diffused. A photoresist mask (not shown) may be used to cover the area of region 142 where region 146 will be formed during this doping step.

Referring to FIG. 13c, the p region 146 is formed. This region 146 may be implanted. The preferred p-type dopant is boron although other dopants may also (or alternatively) be used. A photoresist mask (not shown) is typically used to cover the areas of the device surface that will not be doped.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor structure comprising:

a semiconductor layer of a first conductivity type;

a first doped region disposed within said semiconductor layer and of a second conductivity type different than said first conductivity type and having a first doping concentration;

a contact structure overlying and in contact with said first doped region;

a first well region of said second conductivity type formed in said semiconductor layer beneath said contact region extending through said first doped region and into said layer, said first well region having a doping concentration less than said first doping concentration;

a second well region of said second conductivity type formed in said layer and spaced from said first doped region;

a second doped region of said second conductivity type formed in said second well region;

a third doped region of said first conductivity type formed in said second well region; and a fourth doped region of said second conductivity type formed in said semiconductor layer and spaced from said first doped region, said fourth doped region partially overlapping said second well region.

2. The structure of claim 1 and further comprising a conductive region formed over said semiconductor layer and insulated therefrom, said conductive region formed over an area between said first and fourth doped regions.

3. The structure of claim 2 wherein said conductive region is insulated from said semiconductor layer by a thick gate oxide.

4. The structure of claim 2 Wherein said conductive region is insulated from said semiconductor layer by a thin gate oxide.

5. The structure of claim 1 wherein said contact is disposed over said first doped region and overlies said semiconductor layer.

6. The structure of claim 1 wherein said first conductivity type comprises p-doped semiconductor.

7. The structure of claim 1 wherein said semiconductor comprises silicon.

8. The structure of claim 1 wherein said first doped region is coupled to a reference voltage.

9. A silicon controlled rectifier device for protecting a circuit structure which is coupled to a first node comprising:

a first lightly doped region having a first conductivity type formed in a lightly doped substrate having a second conductivity type;

a first heavily doped region formed in said lightly doped region having said first conductivity type, said first heavily doped region being electrically connected to said first node;

a second heavily doped region formed in said lightly doped region having said second conductivity type, said second heavily doped region being electrically connected to said first node;

a third heavily doped region formed in said substrate having said first conductivity type, said third heavily doped region being spaced from said first lightly doped region and said third heavily doped region being electrically connected to a second node;

a second lightly doped region having said first conductivity type formed within said substrate beneath said third heavily doped region; and a fourth heavily doped region formed at the intersection of said first lightly doped region and said substrate, said fourth heavily doped region having said first conductivity type, said fourth heavily doped region positioned between said second and third heavily doped regions.

10. The device of claim 9 and further comprising a resistor having a first terminal electrically connected to said first node and having a second terminal electrically connected to said fourth heavily doped region, said combination forming a silicon controlled rectifier device which provides an over-voltage current path between said first and second nodes to protect the circuit structure from damage of the type caused by electrostatic discharge between said nodes.

11. The device of claim 9 wherein said first conductivity type is N and said second conductivity type is P.

12. The device of claim 1 wherein said first node is a bond pad of an integrated circuit.

* * * * *